(12) United States Patent
Lin et al.

(10) Patent No.: US 6,642,593 B2
(45) Date of Patent: Nov. 4, 2003

(54) MICROELECTROMECHANICAL SWITCH

(75) Inventors: Tsen-Hwang Lin, Dallas, TX (US); Yu-Pei Chen, Plano, TX (US); Darius L. Crenshaw, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 179 days.

(21) Appl. No.: 09/741,128

(22) Filed: Dec. 19, 2000

(65) Prior Publication Data

US 2001/0048141 A1 Dec. 6, 2001

Related U.S. Application Data

(60) Provisional application No. 60/173,217, filed on Dec. 27, 1999.

(51) Int. Cl.[7] .............................................. H01L 29/82
(52) U.S. Cl. ...................................... 257/415; 257/254
(58) Field of Search ................................ 257/415, 254, 257/275, 414

(56) References Cited

U.S. PATENT DOCUMENTS

| 5,367,136 | A | * | 11/1994 | Buck | 200/600 |
|---|---|---|---|---|---|
| 5,619,061 | A | * | 4/1997 | Goldsmith et al. | 257/528 |
| 5,880,921 | A | | 3/1999 | Tham et al. | 361/233 |
| 6,100,477 | A | * | 8/2000 | Randall et al. | 200/181 |
| 6,171,970 | B1 | * | 1/2001 | Xing et al. | 438/706 |
| 6,376,787 | B1 | * | 4/2002 | Martin et al. | 200/181 |

* cited by examiner

*Primary Examiner*—Phat X. Cao
(74) *Attorney, Agent, or Firm*—Jacqueline J. Garner; Wade James Brady, III; Frederick J. Telecky, Jr.

(57) ABSTRACT

A microelectromechanical switch includes a substrate, an insulator layer disposed outwardly from the substrate, and an electrode disposed outwardly from the insulator layer. The switch also includes a dielectric layer disposed outwardly from the insulator layer and the electrode, the dielectric layer having a dielectric constant of greater than or equal to twenty. The switch also includes a membrane layer disposed outwardly from the dielectric layer, the membrane layer overlying a support layer, the support layer operable to space the membrane layer outwardly from the dielectric layer.

10 Claims, 2 Drawing Sheets

MICROELECTROMECHANICAL SWITCH

CROSS REFERENCE TO PRIOR APPLICATIONS

This application is a division of Ser. No. 09/741,128 which claims priority based upon Provisional Application Serial No. 60/173,217, filed Dec. 27, 1999.

TECHNICAL FIELD OF THE INVENTION

This invention relates in general semiconductor processing, and more specifically to an improved microelectromechanical switch.

BACKGROUND OF THE INVENTION

Recently, microelectromechanical switches have attracted much interest as devices that provide an important way of switching radio frequency signals due to their low insertion loss, good isolation, and high power handling. Additionally, microelectromechanical switches allow for very low power requirements compared to other radio frequency switching devices such as p-i-n diodes. However, present microelectromechanical switches experience difficulty providing sufficient radio frequency signal differentiation between the operation of the switch in an on mode versus an off mode. More specifically, impedance across such a microelectromechanical switch when the switch is turned on may not be sufficiently different from the impedance when the switch is turned off. Such an insufficient differential may result in a radio frequency signal being detected across a switch when the switch is in the off position that is not sufficiently different in strength from a radio frequency signal detected across the switch when the switch is in the on position. Such problems in signal differentiation impact the performance of microelectromechanical switches in wireless applications such as, for example, cellular telephony.

SUMMARY OF THE INVENTION

In accordance with the present invention, an improved microelectromechanical switch is provided that substantially eliminates or reduces disadvantages and problems associated with previous developed systems and methods.

In one embodiment of the present invention, a microelectromechanical switch is disclosed that includes a substrate, an insulator layer disposed outwardly from the substrate, and an electrode disposed outwardly from the insulator layer. The switch also includes a dielectric layer disposed outwardly from the insulator layer and the electrode, the dielectric layer having a dielectric constant of greater than or equal to twenty. The switch also includes a membrane layer disposed outwardly from the dielectric layer, the membrane layer overlying a support layer, the support layer operable to space the membrane layer outwardly from the dielectric layer.

In another embodiment of the present invention, a method of forming a microelectromechanical switch is disclosed that includes forming a substrate, forming an insulator layer outwardly from the substrate, and forming an electrode outwardly from the insulator layer. The method also includes forming a dielectric layer outwardly from the electrode, the dielectric layer having a dielectric constant of greater than or equal to twenty. The method further includes forming a membrane layer outwardly and spaced apart from the dielectric layer, the membrane layer being spaced apart from the dielectric layer by a support layer.

Various embodiments of the present invention present several technical advantages. One advantage of various embodiments of the present invention is an improved microelectromechanical switch that overcomes disadvantages of previous methods and devices. A further advantage of various embodiments of the present invention is that a microelectromechanical switch is presented that allows for significant signal differentiation between a radio frequency signal detected during the on and off operating modes of a microelectromechanical switch. Another advantage of various embodiments of the present invention is that a microelectromechanical switch is presented that allows for effective switching of radio frequency signals in size critical wireless applications. A further advantage of the various embodiments of the present invention is that a microelectromechanical switch is presented that achieves switching of radio frequency signals without significant power dissipation.

Other technical advantages will be readily apparent to one skilled in the art from the following figures, descriptions and claims.

BRIEF DESCRIPTION OF THE DRAWINGS

For a more complete understanding of the present invention and its advantages, reference is now made to the following description taken in conjunction with the accompanying drawings in which.

DETAILED DESCRIPTION OF THE INVENTION

The preferred embodiment of the present invention and its advantages are best understood by referring now in more detail to FIGS. 1A–1H of the drawings, in which like numerals refer to like parts.

FIGS. 1A–1H are cross-sectional schematic diagrams illustrating the formation of a microelectromechanical switch 10 that allows for significant signal differentiation between on and off operating modes of switch 10. In particular, switch 10 utilizes a dielectric material having a high dielectric constant in order to maximize the on-capacitance, or capacitance when switch 10 is in an on operating mode. An on operating mode of switch 10 corresponds to a mode in which signal transmission is intended to occur. By maximizing the on-capacitance, the impedance of switch 10 during such on operating mode is significantly reduced to allow for increased signal transmission across switch 10. Such an increase in the strength of radio frequency signals detected across switch 10 allows for an increased signal differentiation to be achieved between on and off operating modes of switch 10.

Figure 1A:
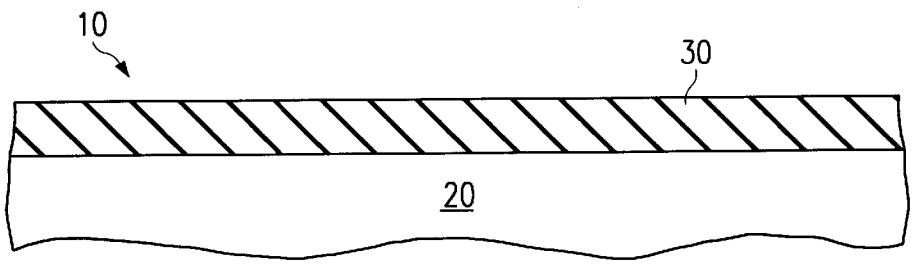
FIGS. 1A–1H are cross-sectional schematic diagrams illustrating the formation of a microelectromechanical switch according to the teachings of the present invention.

FIG. 1A illustrates one embodiment of the formation of an insulator layer 30 outwardly from a substrate 20 in switch 10. Substrate 20 is a microwave quality silicon substrate; however, substrate 20 may be any other microwave quality substrate, including a quartz or sapphire substrate. Insulator layer 30 is a silicon dioxide layer formed outwardly from substrate 20 using a thermal oxidation process or chemical vapor deposition process in order to deposit or grow silicon dioxide to a thickness of approximately 1.2 microns. Alternatively, insulator layer 30 may be any other suitable insulator formed by any suitable semiconductor process so long as significant texturing, roughness, or asperities do not result along the surface of insulator layer 30 such that the performance of switch 10 is impacted. Such alternative embodiments of insulator layer 30 may be formed to any suitable thickness so long as such thickness is sufficient to shield substrate 20 from subsequent semiconductor processing steps in order to prevent the formation of shorts or other defects between substrate 20 and other overlying layers.

Figure 1B:
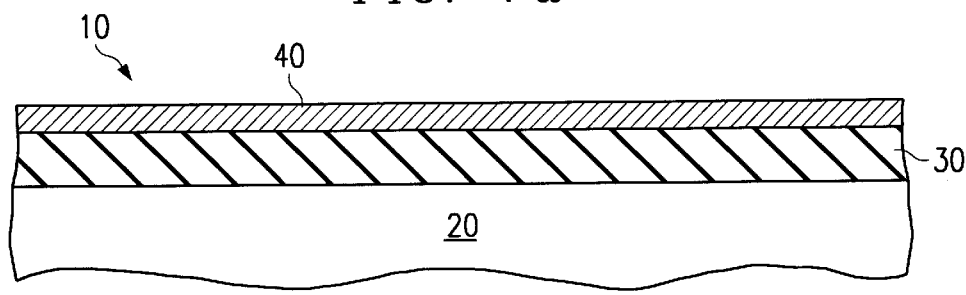

FIG. 1B illustrates one embodiment of the formation of an electrode layer 40 outwardly from insulator 30 of switch 10. Electrode layer 40 is an aluminum layer formed using an e-beam deposition process to a thickness of approximately four thousand angstroms. Alternatively, electrode layer 40 may be copper or any other suitable conductor having a low resistivity and formed using sputtering or any other suitable semiconductor process to any suitable thickness.

Figure 1C:
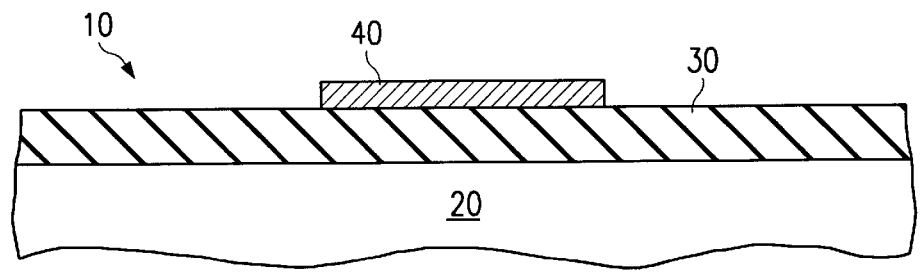

FIG. 1C illustrates one embodiment of an etch of electrode layer 40 to form a bottom electrode of switch 10. More particularly, electrode layer 40 may be patterned using conventional photolithography processes and subsequently etched using an isotropic wet etch that is selective with respect to the material of electrode layer 40 as compared to the material of insulator layer 30. Other suitable etch processes may be used so long as such etch does not damage insulator layer 30 and substrate 20. Etch process selection, and the particular etchants utilized, may also be determined by the material selected to form electrode layer 40.

Figure 1D:
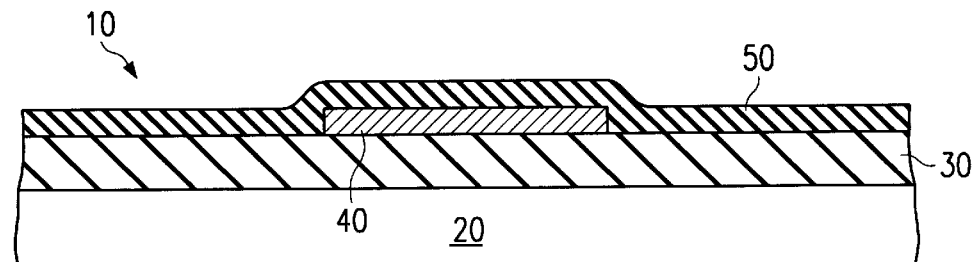

FIG. 1D illustrates one embodiment of the formation of a dielectric layer 50 outwardly from electrode layer 40 and insulator 30. Dielectric layer 50 is a layer of tantalum pentoxide deposited using reactive sputtering to form dielectric layer 50 to a thickness of approximately 1,000 to 1,500 angstroms. Alternatively, dielectric layer 50 may be formed using any dielectric material having a dielectric constant greater than or equal to twenty that displays low leakage currents and that is characterized by formation at a temperature low enough to prevent damage to the material of the underlying electrode layer 40. Examples of oxide families having dielectric constants greater than twenty that may be used to form dielectric layer 50 are $Ta_xO$, $Ti_xO_y$, barium strontium titanate (hereafter "BST"), and strontium titanate (hereafter "STO"). Such materials may be easily formed as dielectric layer 50. For example, the materials $Ta_2O_5$ and $TiO_2$ may be easily deposited by methods such as reactive sputtering.

Various embodiments of dielectric layer 50 may be formed to any suitable thickness using any suitable process depending on the desired impedance characteristics of switch 10. Dielectric layer 50 may also be selected such that the etch of the material of insulator layer 50 described in FIG. 1E maintains a high level of selectivity relative to the material of electrode layer 40 and the material of a support layer 60 described in reference to FIG. 1F. The described selection of high dielectric material used to form insulator layer 50 offers several operational advantages that are further described in reference to FIG. 1H.

Figure 1E:
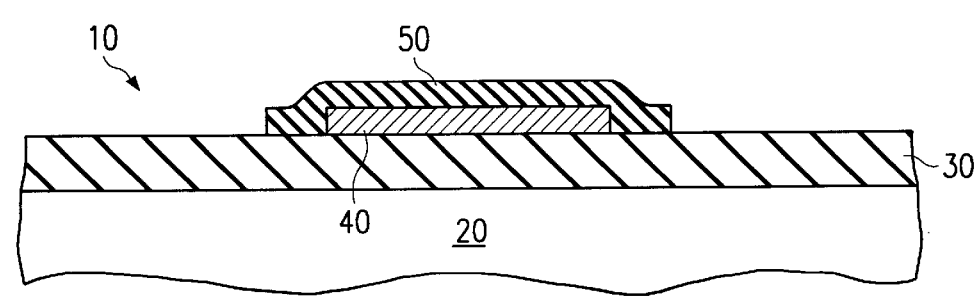

FIG. 1E illustrates one embodiment of an etch of dielectric layer 50 to form an insulative region around the bottom electrode of switch 10 formed from electrode layer 40. In particular, dielectric layer 50 is patterned using conventional photolithography techniques and subsequently etched using a dry etch that is selective with respect to dielectric layer 50 as compared to electrode layer 40. Dielectric layer 50 and insulator layer 30 may both contain oxide material in various embodiments of the present invention. Thus, the thickness of insulator layer 30 formed as described in FIG. 1B should be sufficient such that an etch of dielectric layer 50 may etch a significant thickness of insulator layer 30 and still leave a sufficient thickness of insulator layer 30 so as to both shield substrate 20 in subsequent processing and isolate substrate 20 during operation of switch 10. Other alternative etch processes may be utilized to form the insulative region out of dielectric layer 50, provided such processes do not utilize techniques that may serve to damage the material of the bottom electrode formed from electrode layer 40.

Figure 1F:
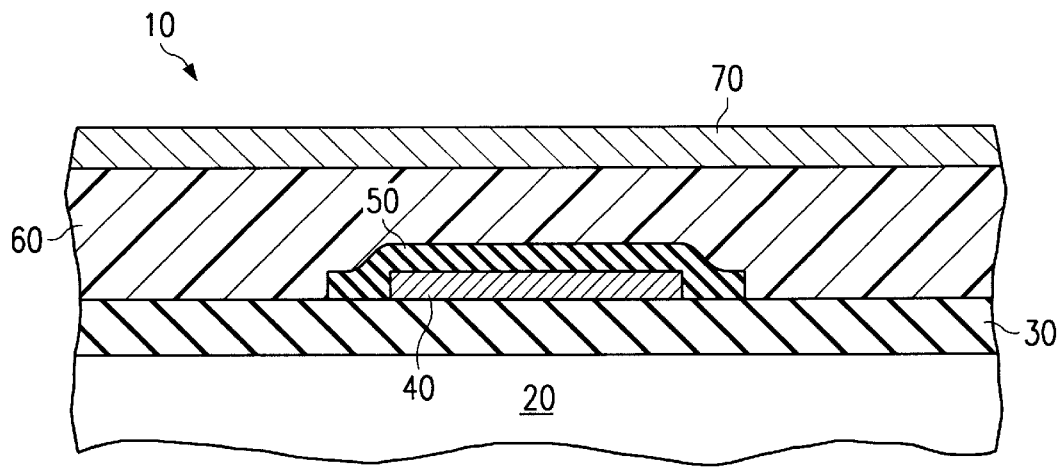

FIG. 1F illustrates one embodiment of the formation of support layer 60 and a membrane layer 70 outwardly from insulator layer 30 and etched dielectric layer 50 in semiconductor device 10.

Support layer 60 is a layer of photoresist formed to a thickness of two microns using conventional photolithography. Alternatively, support layer 60 may be any suitable polymer or other insulative material capable of being removed using an etch process that is selective with respect to the material of support layer 60 as compared to the material of membrane layer 70 and dielectric layer 50.

Membrane layer 70 is an aluminum layer formed using a sputtering process to a thickness of three thousand angstroms; however, membrane layer 70 may be formed using any suitable conductive material having a low resistivity and using any suitable semiconductor process to form a thickness suitable for the selected application of switch 10.

Figure 1G:
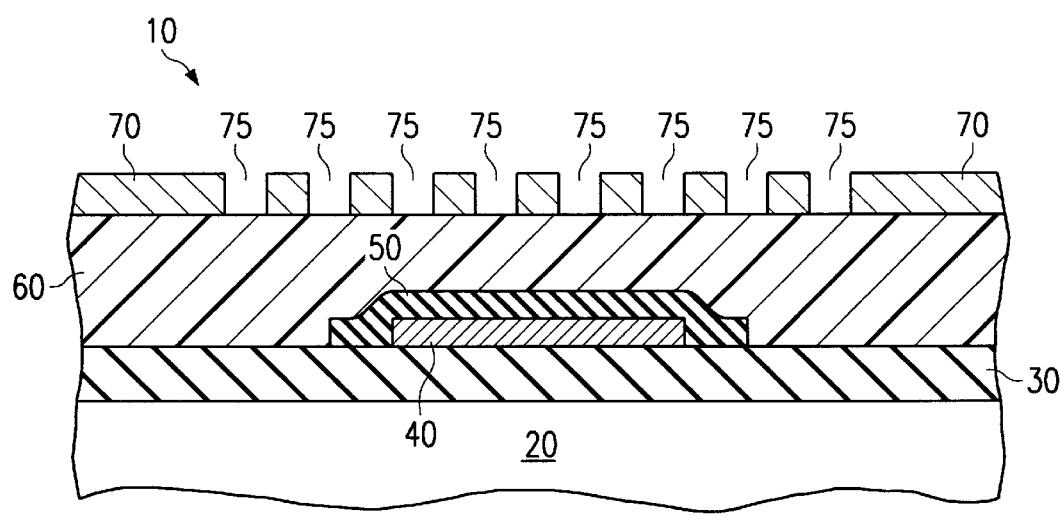

FIG. 1G illustrates one embodiment of the formation of vias 75 in membrane layer 70. In particular, vias 75 are formed using a conventional photolithography pattern process that is followed by a subsequent wet isotropic etch to form vias 75. Other suitable processes can be utilized so long as vias 75 completely penetrate membrane layer 70 without significant deterioration of support layer 60.

Figure 1H:
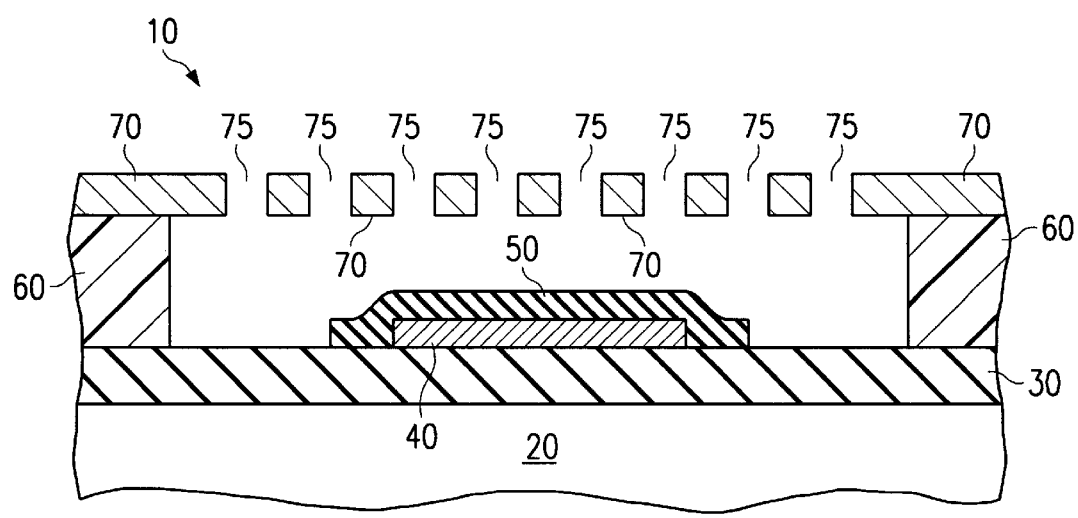

FIG. 1H illustrates one embodiment of the etch of support layer 60 to form semiconductor device 10. In particular, an isotropic dry etch of support layer 60 is performed through vias 75 using etchants that are highly selective to the material of support layer 60 relative to the material of membrane layer 70 and dielectric layer 50. For example, for a given dielectric layer 50 formed from tantalum oxide and a given membrane layer 70 formed from aluminum, an etchant environment of $NF_3$ and $O_2$ may be utilized to perform a plasma etch. As described earlier with regard to the etch of dielectric layer 50, some removal of insulator layer 30 may be permissible during the isotropic etch of support layer 60 if an adequate thickness of material is used to form insulator layer 30.

In operation of switch 10, an radio frequency signal may enter switch 10 either through the bottom electrode formed from electrode layer 40 or from the electrode including membrane layer 70. Such radio frequency signal will be transmitted to the opposite electrode of switch 10 if membrane layer 70 is in contact with dielectric layer 50. Such contact occurs upon application of an electrical bias of appropriate magnitude between electrode layer 40 and membrane layer 70. Such contact is accomplished by the attraction of membrane layer 70 towards electrode layer 40 by the presence of a biased electric field and because of the flexibility of membrane layer 70 provided by vias 75. Thus, an electric bias supplied between layers 40 and 70 corresponds to an on operating mode of switch 10, whereas the absence of such bias corresponds to the off operating mode of switch 10.

In the off mode, the capacitance of switch 10 $c_{off}$ is approximately $\in_{air} A/D_{air}$. A is the cross-sectional area of electrode layer 40 as illustrated in FIG. 1H. More particularly, A is the cross-sectional area over which membrane layer 70 and electrode layer 40 overlap in FIG. 1H. $\in_{air}$ is the dielectric constant of air and $D_{air}$ is the distance between the illustrated inward surface of membrane layer 70 and illustrated outward surface of dielectric layer 50 as illustrated in FIG. 1H. Thus, the off-capacitance of switch 10 is based on the dielectric constant of air. In the on operating mode of switch 10, after the electrode formed by membrane layer 70 is electrostatically deflected to rest atop dielectric layer 50, the on-capacitance of switch 10 $c_{on}$ is approximately $\in_{die} A/D_{die}$. $\in_{die}$ is the dielectric constant of the material forming dielectric layer 50 and $D_{die}$ is the thickness of dielectric layer 50.

As the cross-sectional overlap A is constant between the two operating modes of switch 10, the factors $\in_{air}$, $\in_{die}$, $D_{air}$, and $D_{die}$ determine any difference between the on- and off- capacitances of switch 10. As impedance across switch 10 varies inversely with the capacitance across switch 10, the signal differentiation between such on and off modes of switch 10 is largely determined by the relative difference or ratio between the dielectric constant of air $\in_{air}$ and the dielectric constant of the material comprising dielectric layer 50 $\in_{die}$. Thus, to achieve a high level of signal differentiation between the on and off operating modes of switch 10, the dielectric constant of the material comprising dielectric layer 50 needs to be sufficiently higher than the dielectric strength of air in order to provide a $c_{on}/c_{off}$ ratio sufficient for effectively switching radio frequency signals using switch 10. Thus, the formation of dielectric layer 50 as described in reference to FIG. 1D, provides a high $c_{on}$ value and therefore a high $c_{on}/c_{off}$ ratio to achieve a significant improvement in signal differentiation radio frequency and wireless applications.

Although the present invention has been described in detail, it should be understood that various changes, alterations, substitutions and modifications may be made to the teachings described herein without departing from the spirit and scope of the invention which is solely defined by the appended claims.

What is claimed is:

1. A microelectromechanical switch comprising:

a substrate;

an insulator layer disposed outwardly from the substrate;

an electrode having an outward surface and opposing sidewalls, said electrode disposed outwardly from the insulator layer which is one of an input or an output;

a dielectric layer covering said outward surface and said opposing sidewalls of said electrode and disposed outwardly from the insulator layer and the electrode, the dielectric layer having a dielectric constant of at least twenty; and an electrically conductive flexible membrane layer disposed outwardly from the dielectric layer and movable between said dielectric layer and a locus outwardly spaced from said dielectric layer which is one of an input or an output; said electrically conductive flexible layer comprising a sheet of electrically conductive material having a plurality of vias extending therethrough;

said dielectric layer electrically isolating said electrically conductive flexible membrane from said electrode.

2. The switch of claim 1, wherein the dielectric layer comprises a tantalum oxide.

3. The switch of claim 1, wherein the dielectric layer comprises tantalum pentoxide.

4. The switch of claim 1, wherein the dielectric layer comprises a titanium oxide.

5. The switch of claim 1, wherein the dielectric layer comprises titanium dioxide.

6. The switch of claim 1, wherein the dielectric layer comprises a material that is deposited using reactive sputtering.

7. The switch of claim 1, wherein the dielectric layer comprises BST.

8. The switch of claim 1, wherein the dielectric layer comprises STO.

9. The switch of claim 1, wherein the dielectric layer comprises a material having a deposition temperature lower than a temperature at which the material of the electrode deteriorates.

10. The switch of claim 1, wherein the dielectric layer is selected in response to a desired amount of leakage current.

* * * * *